United States Patent [19]

Saito et al.

[11] Patent Number: 5,042,493

[45] Date of Patent: Aug. 27, 1991

[54] ULTRASONIC PROBE AND METHOD OF MANUFACTURING THE SAME

[75] Inventors: Koetsu Saito, Tokyo; Masami Kawabuchi, Yokohama, both of Japan

[73] Assignee: Matsushita Electric Industrial Co., Ltd., Japan

[21] Appl. No.: 365,405

[22] Filed: Jun. 13, 1989

[30] Foreign Application Priority Data

Jun. 15, 1988 [JP] Japan ................................ 63-147455

[51] Int. Cl.[5] .......................... A01B 8/00; H01L 41/22

[52] U.S. Cl. ............................... 128/662.03; 29/25.35; 310/369

[58] Field of Search ............... 29/25.35; 310/334, 335, 310/365-366, 369, 371; 73/632; 128/660.1, 662.03

[56] References Cited

U.S. PATENT DOCUMENTS

| | | | |
|---|---|---|---|
| 4,530,139 | 7/1985 | Miller | 29/25.35 |
| 4,734,963 | 4/1988 | Ishiyama | 29/25.35 |
| 4,787,126 | 11/1988 | Oliver | 29/25.35 |
| 4,894,895 | 1/1990 | Rokurohta et al. | 29/25.35 |
| 4,939,836 | 7/1990 | Shoup | 29/25.35 |

*Primary Examiner*—Francis Jaworski
*Attorney, Agent, or Firm*—Lowe, Price, LeBlanc & Becker

[57] ABSTRACT

A laminated body is formed. The laminated body includes layers. One of the layers includes a piezoelectric array. The laminated body is engaged with both a pressing film and a curved member having a curved outer surface. A tension is exerted on the pressing film to press the laminated body against the curved outer surface of the curved member so that the laminated body is bent along the curved outer surface of the curved member. The use of the pressing film may be replaced by a process in which at least one of the layers is subjected to a tension to bend the laminated body.

8 Claims, 4 Drawing Sheets

ULTRASONIC PROBE AND METHOD OF MANUFACTURING THE SAME

BACKGROUND OF THE INVENTION

1. Field of the Invention

This invention relates to an ultrasonic probe for ultrasonic systems such as medical ultrasonic diagnostic systems. This invention also relates to a method of manufacturing such an ultrasonic probe.

2. Description of the Prior Art

Recently, convex-type ultrasonic probes have been extensively used in medical ultrasonic diagnostic systems since they can observe ranges wider than those observed by linear-scan ultrasonic probes.

Japanese published unexamined patent application 61-109556 discloses a method of manufacturing such a convex-type ultrasonic probe. As will be described hereinafter, the method of Japanese patent application 61-109556 has some problems.

SUMMARY OF THE INVENTION

It is an object of this invention to provide an excellent convex-type ultrasonic probe.

It is another object of this invention to provide an excellent method of manufacturing such a convex-type ultrasonic probe.

In accordance with this invention, a method of manufacturing an ultrasonic probe comprises the step of forming a laminated body including layers, wherein one of the layers includes a piezoelectric array; the step of engaging the laminated body with both a pressing film and a curved member having a curved outer surface; and the step of exerting a tension on the pressing film to press the laminated body against the curved outer surface of the curved member and thereby bending the laminated body along the curved outer surface of the curved member. The use of the pressing film may be replaced by a process in which at least one of the layers is subjected to a tension to bend the laminated body.

In accordance with this invention, an ultrasonic probe comprises a back load layer; a layer including a piezoelectric array; a first acoustic matching layer; a second acoustic matching layer; and a layer including an acoustic lens; wherein the back load layer, the piezoelectric array layer, the first acoustic matching layer, the second acoustic matching layer, and the acoustic lens layer are combined into a laminated structure; the piezoelectric array layer, the first acoustic matching layer, and the second acoustic matching layer extend between the back load layer and the acoustic lens layer; the piezoelectric array layer extends between the back load layer and the first acoustic matching layer; the second acoustic matching layer extends between the first acoustic matching layer and the acoustic lens layer; the piezoelectric array layer and the first acoustic matching layer have grooves by which segments of the piezoelectric array are acoustically separated from each other; ends of the grooves are closed by the second acoustic matching layer; the laminated structure curves; the segments of the piezoelectric array align along a curved line; and a curved alignment of the piezoelectric array segments occupies an angular range greater than 180°.

DESCRIPTION OF THE PREFERRED EMBODIMENT

Before the description of this invention, a prior art method of manufacturing a convex-type ultrasonic probe which is disclosed in Japanese published unexamined patent application 61-109556 will be described hereinafter for a better understanding of this invention.

Figure 1:
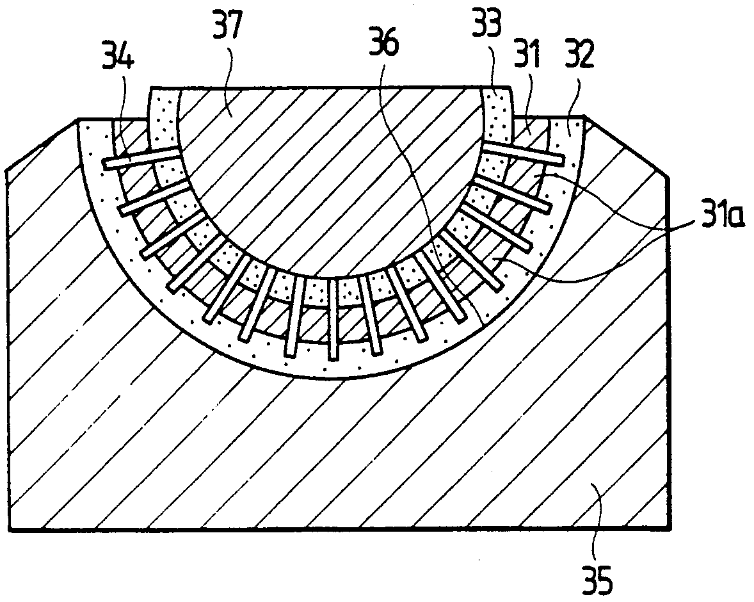
FIG. 1 PRIOR ART
FIG. 1 is a sectional view of a prior art ultrasonic probe.

FIG. 1 shows a prior art convex-type ultrasonic probe of Japanese patent application 61-109556. This prior art ultrasonic probe is manufactured as follows. Firstly, junction printed boards (not shown) each having an array of electric terminals are bonded to opposite sides of a piezoelectric member 31 which originally has a flat plate shape or a flat layer shape. Opposite surfaces of the piezoelectric layer 31 are provided with electrodes (not shown). Secondly, a zigzag array of electrodes is provided on one surface of the piezoelectric layer 31 along a scanning direction by vapor deposition or plating. Then, epoxy resin containing metal powder is poured into a given region to form an acoustic matching layer 32 on one surface of the piezoelectric layer 31. The acoustic matching layer 32 is shaped by cutting and grinding processes so that the thickness of the layer 32 equals a quarter wavelength of a related ultrasonic wave. Similarly, a back matching layer 33 is formed on the other surface of the piezoelectric layer 31. The back matching layer 33 and the piezoelectric layer 31 are divided into segments along the electrode array by cutting grooves 34 from an exposed surface of the back matching layer 33. For example, a dicing machine is used in cutting the grooves 34. The grooves 34 reach the acoustic matching layer 32. The divided segments of the piezoelectric layer 31 form a piezoelectric array 31*a*. When the piezoelectric layer 31 is divided, the printed boards are also divided and the electric terminals on the printed boards are correspondingly separated. After a laminated body including the piezoelectric array 31*a*, the acoustic matching layer 32, and the back matching layer 33 is placed in a support mold 35, the laminated body is pressed against a semicylindrical concave surface 36 of the support mold 35 and is thus convexedly curved along the surface 36. In this way, the piezoelectric array 31*a* is made into a convex configuration. Then, back load material 37 is inserted into a region inside the back matching layer 33 and is then bonded to the back matching layer 33 by adhesive. Finally, electric leads are taken out from the respective electric terminals on the printed boards.

In general, the angle of a region monitored by an ultrasonic probe is determined by the angular range occupied by a curved piezoelectric array. Therefore, a wide angle of the monitored region is realized by a curved piezoelectric array having a large angular dimension.

In the prior art method of Japanese patent application 61-109556, the angular dimension of the curved inner surface 36 of the support mold 35 is limited to 180° or less in order to allow the placement of the combination of the piezoelectric array 31*a*, the acoustic matching layer 32, and the back matching layer 33 into the support mold 35 via an opening of the support mold 35. Therefore, the angular dimension of the convex piezoelectric array 31*a* which determines the angle of a region monitored via the ultrasonic probe is also limited to 180° or less. In addition, the adhesive tends to enter the grooves 34. The adhesive which enters the grooves 34 causes crosstalk between the segments of the piezoelectric array 31*a*.

Figure 2:
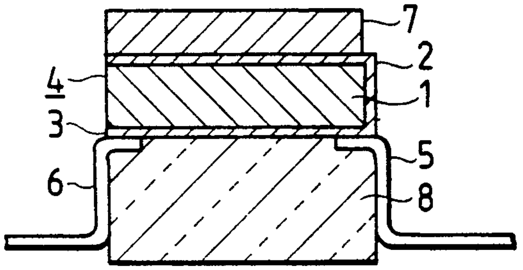
FIG. 2 is a sectional view of a laminated structure which is present during the manufacture of an ultrasonic probe in an embodiment of this invention.
Figure 3:
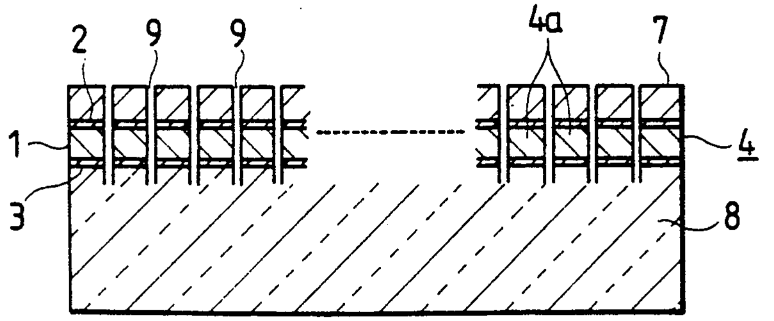
FIG. 3 is a sectional view of the laminated structure which is present during the manufacture of the ultrasonic probe in the embodiment of this invention.

An embodiment of this invention will be described hereinafter with reference to FIGS. 2–8. An ultrasonic probe of this invention is manufactured as follows. As shown in FIG. 2 and 3, films of electrodes 2 and 3 are formed on uppper and lower surfaces of a plate-shaped piezoelectric element 1 respectively by vapor deposition or baking so that a plate-shaped piezoelectric member or vibrator 4 is obtained. As shown in FIG. 2, the electrode 2 extends further from the upper surface of the piezoelectric element 1 and bends at the corner between the upper and a right-hand end face of the piezoelectric element 1. The electrode 2 extends along the end face of the piezoelectric element 1, bending inwardly and then extending along an edge portion of the lower surface of the piezoelectric element 1. The electrode 3 extends on a major portion of the lower surface of the piezoelectric element 1.

Flexible electric terminals 5 and 6 are connected, by soldering or electrically-conductive adhesive, to the portions of the respective electrodes 2 and 3 which extend on opposite side edges of the lower surface of the piezoelectric element 1. Then, epoxy resin containing metal powder such as tungsten powder is poured into a region above the portion of the electrode 2 which extends on the upper surface of the piezoelectric element 1. The epoxy resin with the metal powder forms a first acoustic matching layer 7. The introduction of the metal powder into the epoxy resin enables a suitable acoustic impedance of the matching layer 7. It should be noted that a previously-formed first acoustic matching layer 7 may be bonded to the electrode 2 by adhesive. After the first acoustic matching layer 7 is formed, back load material 8 is poured into a region defined by the electrode 3 and the electric terminals 5 and 6. It should be noted that a previously-formed back load member 8 may be placed in position and be bonded to the electrode 3 and the electric terminals 5 and 6 by adhesive. One example of the back load material 8 is composed of epoxy resin which contains tungsten powder and micro-balloons. This example of the back load material 8 becomes soft and easily deformable at temperatures higher than the room temperature. A second example of the back load material 8 includes rubber-like material which is soft at the room temperature and which has a large damping factor for acoustic waves.

It should be noted that the first acoustic matching layer 7 may be formed after the provision of the back load material 8.

As shown in FIG. 3, the first acoustic matching layer 7 and the piezoelectric member 4 are divided into segments by cutting grooves 9 from above with a suitable device such as a dicing saw. The electric terminals 5 and 6 are also cut along the grooves 9. The grooves 9 are spaced at predetermined intervals. The grooves 9 extend through the first acoustic matching layer 7 and the piezoelectric member 4 and reach the back load material 8. The divided segments of the piezoelectric member 4 form a piezoelectric array 4*a*. The divided segments of the piezoelectric member 4 correspond to respective channels of transmission and reception of acoustic waves. As a result of the previously-mentioned steps, a laminated combination of the acoustic layer 7, the piezoelectric array 4*a*, and the back load material 8 is obtained.

Figure 4:
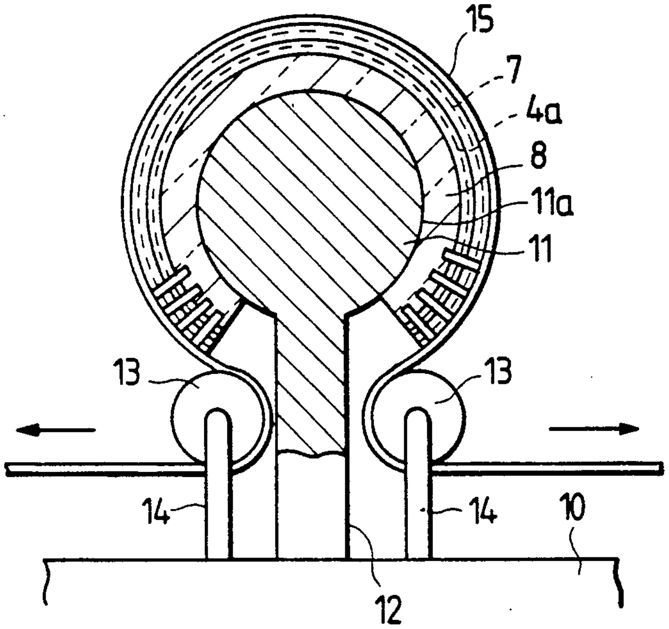
FIG. 4 is a sectional view of the laminated structure and a manufacturing device in the embodiment of this invention.

As shown in FIG. 4, a member 11 made of hard material such as aluminum has a curved surface 11*a* with a predetermined curvature. The curved member 11 has a cylindrical surface whose angular dimension is significantly greater than 180°. In other words, the cylindrical surface of the curved member 11 occupies an angular range considerably greater than 180°. For example, the cylindrical surface of the curved member 11 occupies an angular range greater than 270°. The curved member 11 has a support 12 detachably mounted on a jig 10. Guide rollers 13 are rotatably mounted on the jig 10 by supports 14.

Adhesive is applied to both of the curved surface 11*a* of the member 11 and an exposed surface of the back load material 8 which is remote from the piezoelectric array 4*a*. Then, the laminated combination of the first acoustic matching layer 7, the piezoelectric array 4*a*, and the back load material 8 is placed on the curved member 11 in such a manner that the back load material 8 opposes the curved member 11. After an intermediate portion of a pressing film 15 is extended on the first acoustic matching layer 7, one end of the pressing film 15 is passed through a gap between the support 12 of the curved member 11 and one of the guide rollers 13 and the other end of the pressing film 15 is passed through a gap between the support 12 and the other guide roller 13. In this way, the laminated combination of the first acoustic matching layer 7, the piezoelectric array 4*a*, and the back load material 8 is placed between the curved member 11 and the pressing film 15 and is engaged with both of them. In addition, the pressing film 15 engages the guide rollers 13.

By pulling the ends of the pressing film 15 in the opposite directions, the pressing film 15 is forced to press the laminated combination of the first acoustic matching layer 7, the piezoelectric array 4*a*, and the back load material 8 against the curved surface 11*a* of the curved member 11 so that the laminated combination is bent along the curved surface 11*a* of the curved member 11 and the back load material 8 is bonded to the curved surface 11*a* by the previously-applied adhesive. In this way, the piezoelectric array 4*a* is curved along part of a circle. The size of the piezoelectric array 4*a* is chosen so that the piezoelectric array 4*a* occupies a predetermined angular range significantly greater than 180°. For example, the piezoelectric array 4*a* occupies an angular range of about 270°.

The pressing film 15 is made of polyethylene terephthalate. The pressing film 15 may be made of fluorine-contained resin such as $PVF_2$. In the case where the pressing film 15 has a large coefficient of friction, a tape of fluorine-contained resin may be stuck to the surface of the pressing film 15 which opposes the first acoustic matching layer 7. This resin tape allows smooth movement of the pressing film 15 relative to the first acoustic matching layer 7, so that the first acoustic matching layer 7 can be uniformly pressed by the pressing film 15 and thus the laminated combination of the first acoustic matching layer 7, the piezoelectric array 4*a*, and the back load material 8 can be uniformly curved. The uniform curvature of the laminated combination enables a uniform distribution of the segments of the piezoelectric array 4*a*.

Figure 5:
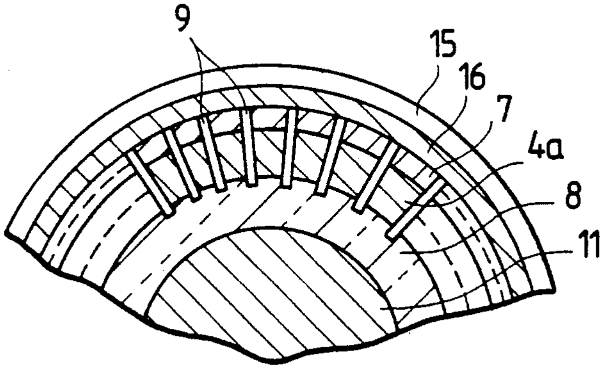
FIG. 5 is a sectional view of part of the laminated structure and part of the manufacturing device in the embodiment of this invention.

After the bending of the laminated combination of the first acoustic matching layer 7, the piezoelectric array 4*a*, and the back load material 8 is completed, the pressing film 15 is loosed and is separated from the laminated combination. Then, a second acoustic matching layer 16 is placed on the first acoustic matching layer 7 and the pressing film 15 is extended on the second acoustic matching layer 16. The second acoustic matching layer 16 is preferably made of a film of adhesive epoxy resin. By pulling the ends of the pressing film 15 in the opposite directions, the pressing film 15 is forced to press the second acoustic matching layer 16 against the first acoustic matching layer 7 so that the second acoustic matching layer 16 is bent along the curved outer surface of the acoustic matching layer 7 and is bonded to the first acoustic matching layer 7 as shown in FIG. 5. In the case where an adhesive film "EA9626" made by Hysol Japan Limited is used for the second acoustic matching layer 16, the second acoustic matching layer 16 is completely bonded to the first acoustic matching layer 7 by heating the second acoustic matching layer 16 at a temperature of 90° C. for 90 minutes. Ends of the grooves 9 are closed by the second acoustic matching layer. The second acoustic matching layer 16 is prevented from entering the grooves 9 so that the grooves 9 remain empty. Therefore, excellent acoustic separation between the segments of the piezoelectric array 4*a* is attained and crosstalk between the array segments is effectively prevented.

It should be noted that the grooves 9 may be filled with material having a large damping factor for acoustic waves. The load material ensures excellent acoustic separation between the segments of the piezoelectric array 4*a*.

Figure 6:
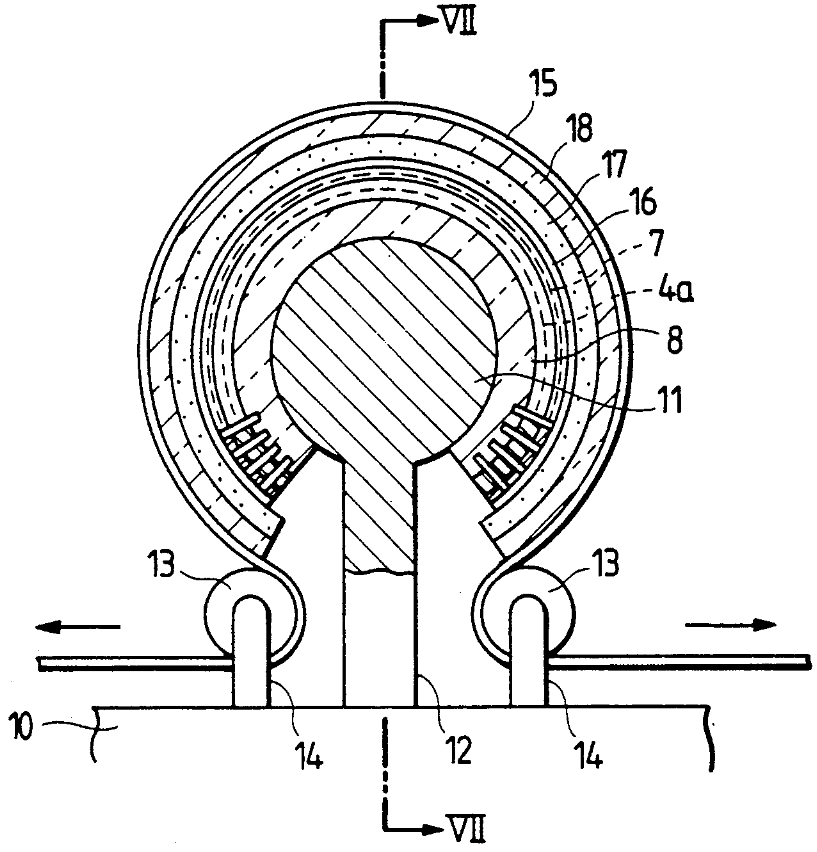
FIG. 6 is a sectional view of the laminated structure and the manufacturing device in the embodiment of this invention.
Figure 7:
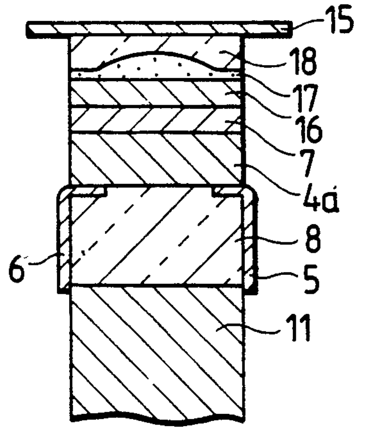
FIG. 7 is a sectional view taken along the line VII—VII of FIG. 6.

After the second acoustic matching layer 16 is bonded to the first acoustic matching layer 7, the pressing film 15 is loosed and is separated from the second acoustic matching layer 16. Then, an acoustic lens 17 is placed on the second acoustic matching layer 16 and a holding member 18 is placed on the acoustic lens 17. As shown in FIG. 7, the acoustic lens 17 is located so that its convex surface faces outward. The acoustic lens 17 is preferably made of silicone rubber or adhesive material. The holding member 18 has a concave surface mating with the convex surface of the acoustic lens 17. The holding member 18 is made of flexible soft material such as silicone rubber, thermoplastic elastomer. Teflon, or polyethylene. The pressing film 15 is extended on the holding member 18. By pulling the ends of the pressing film 15 in the opposite directions, the pressing film 15 is forced to press the acoustic lens 17 against the second acoustic matching layer 16 via the holding member 18 so that the acoustic lens 17 is bent along the curved outer surface of the second acoustic matching layer 16 and is bonded to the second acoustic matching layer 16 as shown in FIGS. 6 and 7. It should be noted that adhesive may be previously provided between the acoustic lens 17 and the second acoustic matching layer 16. Although the acoustic lens 17 has the convex surface, the holding member 18 ensures that the acoustic lens 17 is uniformly curved and is uniformly bonded to the second acoustic matching layer 16. After the bonding of the acoustic lens 17 to the second acoustic matching layer 16 is completed, the holding member 18 is removed from the acoustic lens 17.

Figure 8:
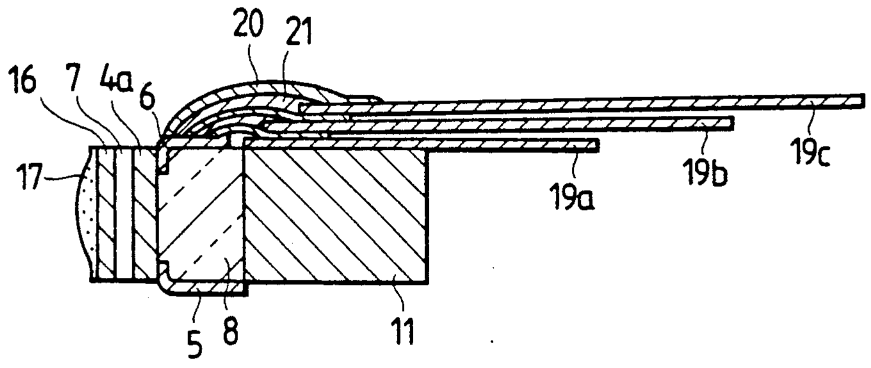
FIG. 8 is a sectional view of the ultrasonic probe in the embodiment of this invention.

Subsequently, as shown in FIG. 8, a flexible electric terminal 19*a* is fixedly provided on the curved member 11. The electric terminals 6 and 19*a* are connected via wires 20 of gold or aluminum by wire bonding processes for the respective channels. Insulating material 21 such as epoxy resin is poured into a region above the connections between the electric terminals 6 and 19*a* to cover and insulate them. Then, a flexible electric terminal 19*b* is fixedly provided on the electric terminal 19*a*. The electric terminals 6 and 19*b* are connected via wires of gold or aluminum by wire bonding processes for the respective channels. Insulating material 21 such as epoxy resin is poured into a region above the connections between the electric terminals 6 and 19*b* to cover and insulate them. Then, a flexible electric terminal 19*c* is fixedly provided on the electric terminal 19*b*. The electric terminals 6 and 19*c* are connected via wires of gold or aluminum by wire bonding processes for the respective channels. Insulating material 21 such as epoxy resin is poured into a region above the connections between the electric terminals 6 and 19*c* to cover and insulate them. Such steps are reiterated. The electric terminals 19*a*–19*c* are combined into a laminated structure which enables a compact design of the ultrasonic probe. The electric terminals 19*a*–19*c* are connected to a cable (not shown) via a connector (not shown).

This embodiment may be modified in various ways as follows. In a first modification, the back load member 8 has a laminated structure. In a second modification, the thickness and height of the support 12 of the curved member 11 are chosen so that the piezoelectric array 4*a* can extend along substantially a full circle and thus piezoelectric array 4*a* can occupy an angular range of about 360°. In a third modification, the piezoelectric array 4*a* includes a high-polymer piezoelectric member made of polyvinylidene fluoride or a composite piezoelectric member made of piezoelectric ceramic and high-polymer resin, and each of the high-polymer member and the composite member is allowed by electrodes to have an array structure. In a fourth modification, at least one of the acoustic matching layers 7 and 16, the back load material 8, and the acoustic lens 17 is omitted. In a fifth modification, the back load material 8 is not bonded to the curved member 11. In a fifth modification, the pressing film 15 is replaced by a mechanism which exerts a tension on the back load member 8 or other layer to bend the laminated combination of the first acoustic matching layer 7, the piezoelectric array 4*a*, and the back load material 8 along the surface of the curved member 11. In one example of the fifth modification, the back load member 8 is previously made in a shape similar to the pressing film 15 and the back load member 8 is subjected to a tension by use of the guide rollers 13 for the bending, and then surplus portions of the back load member 8 are cut away. In a sixth modification, the pressing film 15 is replaced by a mechanism which exerts a tension on the second acoustic matching layer 16 to bend it along the outer surface of the first acoustic matching layer 7. In one example of the sixth modification, the second acoustic matching layer 16 is previously made in a shape similar to the pressing film 15 and the second acoustic matching layer 16 is subjected to a tension by use of the guide rollers 13 for the bending, and then surplus portions of the second acoustic matching layer 16 are cut away. In a seventh modification, the pressing film 15 is replaced by a mechanism which exerts a tension on the acoustic lens 17 or the holding member 18 to bend the laminated combination of the layers 17 and 18 along the surface of the curved member 16. In one example of the seventh modification, the holding member 18 is previously made in a shape similar to the pressing film 15 and the holding member 18 is subjected to a tension by use of the guide rollers 13 for the bending, and then surplus portions of the holding member 18 are cut away. In an eighth modification, the pressing film 15 is crossed at a position below the curved member 11. In a ninth modification, the piezoelectric array 4a has a concave configuration or a wave-shaped configuration.

What is claimed is:

1. A method of manufacturing an ultrasonic probe, comprising the steps of:

forming a laminated body including a back load member, a piezoelectric array extending on the back load member, and a first acoustic matching layer extending on the piezoelectric array;

opposing the back load member to the curved outer surface of the curved member;

engaging the laminated body with both a pressing film and a curved member having a curved outer surface;

exerting a tension on the pressing film to press the laminated body against the curved outer surface of the curved member and thereby bending the laminated body along the curved outer surface of the curved member;

separating the pressing film from the laminated body;

placing a second acoustic matching layer on the first acoustic matching layer of the laminated body;

engaging the second acoustic matching layer with both the pressing film and an outer curved surface of the first acoustic matching layer of the laminated body;

exerting a tension on the pressing film to press the second acoustic matching layer against the curved outer surface of the first acoustic matching layer and thereby bending the second acoustic matching layer along the curved outer surface of the first acoustic matching layer;

separating the pressing film from the second acoustic matching layer;

placing an acoustic lens on the second acoustic matching layer;

placing a holding member on the acoustic lens;

engaging a combination of the acoustic lens and the holding member with both the pressing film and an outer curved surface of the second acoustic matching layer; and exerting a tension on the pressing film to press the combination of the acoustic lens and the holding member against the curved outer surface of the second acoustic matching layer and thereby bending the combination of the acoustic lens and the holding member along the curved outer surface of the second acoustic matching layer.

2. The method of claim 1 wherein each of the tension-exerting steps comprises:

guiding the pressing film by guide members; and pulling opposite ends of the pressing film in opposite directions respectively.

3. The method of claim 1 wherein the holding member is made of soft material.

4. The method of claim 1 wherein the second acoustic matching layer comprises a film of adhesive resin.

5. The method of claim 1 wherein the pressing film has a small coefficient of friction.

6. A method of manufacturing an ultrasonic probe, comprising the steps of:

forming a laminated body including a back load member, a piezoelectric array extending on the back load member, and a first acoustic matching layer extending on the piezoelectric array;

opposing the back load member to a curved outer surface of a curved member;

engaging the laminated body with the curved member;

exerting a tension on at least one of the back load member, the piezoelectric array, and the first acoustic matching layer to press the laminated body against the curved outer surface of the curved member and thereby bending the laminated body along the curved outer surface of the curved member;

placing a second acoustic matching layer on the first acoustic matching layer of the laminated body;

engaging the second acoustic matching with an outer curved surface of the first acoustic matching layer of the laminated body;

exerting a tension on the second acoustic matching layer to press the second acoustic matching layer against the curved outer surface of the first acoustic matching layer and thereby bending the second acoustic matching layer along the curved outer surface of the first acoustic matching layer;

placing an acoustic lens on the second acoustic matching layer;

placing a holding member on the acoustic lens;

engaging a combination of the acoustic lens and the holding member with an outer curved surface of the second acoustic matching layer; and exerting a tension on at least one of the acoustic lens and the holding member to press the combination of the acoustic lens and the holding member against the curved outer surface of the second acoustic matching layer and thereby bending the combination of the acoustic lens and the holding member along the curved outer surface of the second acoustic matching layer.

7. An ultrasonic probe comprising:

a back load layer;

a layer including a piezoelectric array;

a first acoustic matching layer;

a second acoustic matching layer; and a layer including an acoustic lens;

wherein the back load layer, the piezoelectric array layer, the first acoustic matching layer, the second acoustic matching layer, and the acoustic lens layer are combined into a laminated structure; the piezoelectric array layer, the first acoustic matching layer, and the second acoustic matching layer extend between the back load layer and the acoustic lens layer; the piezoelectric array layer extends between the back load layer and the first acoustic matching layer; the second acoustic matching layer extends between the first acoustic matching layer and the acoustic lens layer; the piezoelectric array layer and the first acoustic matching layer have grooves by which segments of the piezoelectric array are acoustically separated; ends of the grooves are closed by the second acoustic matching layer; the laminated structure curves; the segments of the piezoelectric array align along a curved line; and an alignment of the segments of the piezoelectric array occupies an angular range greater than 180°.

8. The ultrasonic probe of claim 7 further comprising a laminated structure including flexible electric terminals and members insulating the electric terminals from each other, and means for electrically connecting the electric terminals to the respective segments of the piezoelectric array.

* * * * *